United States Patent
Kim

(10) Patent No.: US 9,893,127 B2
(45) Date of Patent: Feb. 13, 2018

(54) ORGANIC LIGHT EMITTING DIODE DISPLAY AND METHOD FOR MANUFACTURING THE SAME

(71) Applicant: Samsung Display Co., Ltd., Yongin-si, Gyeonggi-do (KR)

(72) Inventor: Do-Hoon Kim, Asan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/855,199

(22) Filed: Sep. 15, 2015

(65) Prior Publication Data

US 2016/0225833 A1    Aug. 4, 2016

(30) Foreign Application Priority Data

Jan. 29, 2015    (KR) .................. 10-2015-0014271

(51) Int. Cl.
*H01L 29/08* (2006.01)
*H01L 27/32* (2006.01)

(52) U.S. Cl.
CPC ...... *H01L 27/3246* (2013.01); *H01L 27/3216* (2013.01); *H01L 27/3218* (2013.01)

(58) Field of Classification Search
CPC .................. H01L 27/3211; H01L 27/3246
See application file for complete search history.

(56) References Cited

U.S. PATENT DOCUMENTS

| | | | | |
|---|---|---|---|---|
| 2006/0017375 A1* | 1/2006 | Noguchi | ............. | H01L 27/3246 313/504 |
| 2008/0116463 A1* | 5/2008 | Ito | ....................... | H01L 51/5203 257/72 |
| 2008/0252200 A1* | 10/2008 | Wang | .................. | H01L 27/3246 313/504 |
| 2009/0200936 A1* | 8/2009 | Kang | .................. | H01L 51/5203 313/505 |

(Continued)

FOREIGN PATENT DOCUMENTS

| | | |
|---|---|---|
| JP | 2004-319118 A | 11/2004 |
| KR | 10-0617195 B1 | 9/2006 |

(Continued)

*Primary Examiner* — Thao X Le
*Assistant Examiner* — Laura Dykes
(74) *Attorney, Agent, or Firm* — Knobbe, Martens, Olson & Bear, LLP

(57) ABSTRACT

An organic light emitting diode display comprises a substrate comprising a major surface; first, second, third and fourth electrodes positioned over the substrate; a pixel defining layer positioned over the plurality of electrodes and comprising first, second, third and fourth openings; and a spacer positioned over the pixel defining layer. The first, second, third and fourth openings overlap the first, second, third and fourth electrodes, respectively, when viewed in a viewing direction perpendicular to the major surface. The first, second, third and fourth openings comprise first, second, third and fourth corners, respectively, wherein the first, second, third and fourth corners neighbor one another when viewed in the viewing direction. When viewed in the view- (Continued)

ing direction, the spacer comprises at least a portion placed within an imaginary polygon defined by the first, second, third and fourth corners.

18 Claims, 16 Drawing Sheets

(56) References Cited

U.S. PATENT DOCUMENTS

| | | | | |
|---|---|---|---|---|
| 2010/0309172 A1* | 12/2010 | Oh | ................ | H01L 27/3246 345/204 |
| 2012/0025182 A1* | 2/2012 | Umeda | ............ | B41M 5/38214 257/40 |
| 2012/0056531 A1* | 3/2012 | Park | ................ | H01L 27/3211 313/506 |

FOREIGN PATENT DOCUMENTS

| KR | 10-2009-0065604 A | 6/2009 |
|---|---|---|
| KR | 10-2011-0008958 A | 1/2011 |

\* cited by examiner

ORGANIC LIGHT EMITTING DIODE DISPLAY AND METHOD FOR MANUFACTURING THE SAME

CROSS-REFERENCE TO RELATED APPLICATION

This application claims priority to and the benefit of Korean Patent Application No. 10-2015-0014271 filed in the Korean Intellectual Property Office on Jan. 29, 2015, the entire contents of which are incorporated herein by reference.

BACKGROUND (a) Field

The present disclosure relates to an organic light emitting diode display and a method for manufacturing the same.

(b) Discussion of the Related Technology

An organic light emitting diode display includes two electrodes and an organic light emission layer disposed therebetween. Electrons injected from a cathode combine with holes injected from an anode in the organic light emission layer to form excitons and emit light while the excitons emit energy.

The organic light emitting diode display has self-emitting characteristics and unlike a liquid crystal display, need not a separate light source and therefore may be reduced in a thickness and a weight. Further, the organic light emitting diode display is a display which represents high quality characteristics, such as low power consumption, high luminance, and a high response speed and therefore has recently drawn much attention.

In embodiments, The above information disclosed in this Background section is only for enhancement of understanding of the background section and therefore may contain information that does not form the prior art that is already known in this country to a person of ordinary skill in the art.

SUMMARY

One aspect of the invention provides an organic light emitting diode display and a method for manufacturing the same having advantages of including a design of a spacer capable of minimizing the probability of covering an electrode or preventing the electrode from being covered by invading debris of a damaged spacer into an opening of a pixel defining layer even though the spacer is damaged by an external impact.

Another aspect of the invention provides an organic light emitting diode display, which may comprise: a substrate comprising a major surface; a plurality of electrodes positioned over the substrate; a pixel defining layer positioned over the plurality of electrodes and comprising a plurality of openings, each of which is disposed over and overlaps one of the plurality of electrodes; and a spacer positioned over the pixel defining layer, wherein the plurality of electrodes comprises first, second, third and fourth electrodes, wherein the plurality of openings comprises first, second, third and fourth openings overlapping the first, second, third and fourth electrodes, respectively, when viewed in a viewing direction perpendicular to the major surface, wherein the first, second, third and fourth openings comprise first, second, third and fourth corners, respectively, wherein the first, second, third and fourth corners neighbor one another when viewed in the viewing direction, wherein, when viewed in the viewing direction, the spacer comprises at least a portion placed within an imaginary polygon defined by the first, second, third and fourth corners.

In the foregoing device, the plurality of electrodes may further comprise fifth and sixth electrodes, wherein the plurality of openings comprise fifth and sixth openings overlapping the fifth and sixth electrodes, respectively, when viewed in the viewing direction, wherein the device comprises first and second pixels, each of which comprises first, second and third sub-pixels, the first, second and third sub-pixels configured to emit colored light having colors different from one another, wherein the first, third and fifth openings belong to the first, second and third sub-pixels of the first pixel, respectively, wherein the second, fourth and sixth openings belong to the first, second and third sub-pixels of the second pixel, respectively, wherein the first, second, fifth and sixth openings are arranged such that their long sides are substantially parallel to each other when viewed in the viewing direction, wherein the third and fourth openings are arranged such that their long sides are substantially aligned to an imaginary straight line when viewed in the viewing direction, wherein the first and fourth corners are diagonally disposed, and the second and third corners are diagonally disposed.

Still in the foregoing device, when viewed in the viewing direction, the spacer does not comprise a portion disposed between the first and second openings, between the first and third openings, between the second and fourth openings or between the third and fourth openings. The pixel defining layer may further comprise a receiving groove which is formed along a boundary abutting to the pixel defining layer by the spacer to receive at least a portion of the spacer. Each of the first, second, third and fourth openings has a generally rectangular shape, wherein, when viewed in the viewing direction, the first and second openings are arranged such that their long sides are substantially parallel to a first direction and the third and fourth openings are arranged such that their long sides are substantially parallel to a second direction which is perpendicular to the first direction. Each of the first, second, third and fourth corners may be rounded. The cross section in which the spacer may be cut in a direction parallel to the major surface of the substrate has a shape of any one of a polygon, a circle, a semicircle, and an oval. The cross section may have a trapezoidal shape having a pair of sides substantially parallel to each other.

Yet in the foregoing device, when viewed in the viewing direction, the spacer may comprise a center of gravity of a cross section taken parallel to the major surface of the substrate, wherein an imaginary straight line extending from the center and crossing any one of sides of the first, second, third and fourth openings forms an angle with that side, the angle being smaller than 90°, wherein, when viewed in the viewing direction, two imaginary tangential lines extending from the center to any one of the first, second, third and fourth corners form an angle therebetween which is smaller than 90°. When viewed in the viewing direction, the spacer may comprise a center of gravity of a cross section taken parallel to the major surface of the substrate, wherein an imaginary straight line extending from the center and passing any one of the first, second, third and fourth corners passes through the corresponding opening comprising that corner. The third and fourth openings may further comprise fifth and sixth corners, respectively, wherein the device further comprises an additional spacer disposed adjacent the fifth and sixth corners. The device may further comprise an additional spacer having a cross section shape different from that of the spacer when the spacer and the additional spacer are cut in a direction parallel to the major surface of the substrate.

Further in the device, the spacer may be made of the same material as the pixel defining layer. The device may further comprise first, second, third and fourth light emission layers formed over the first, second, third and fourth electrodes within the first, second, third and fourth openings, respectively, wherein each light emission layer comprises an organic light emission material. An area of the third opening may be greater than that of the first opening or the second opening. The first, second, third and fourth openings do not comprise any area overlapping the imaginary polygon when viewed in the viewing direction. When viewed in the viewing direction, the substantially entire portion of the spacer may be enclosed within the imaginary polygon.

Still another aspect of the invention provides a method for manufacturing an organic light emitting diode display, which may comprise: forming a plurality of electrodes over a substrate; forming a pixel defining layer over the substrate and the plurality of electrodes, the pixel defining layer comprising a plurality of openings, each of which is formed over a corresponding one of the plurality of electrodes, and overlaps the corresponding electrode when viewed in a viewing direction perpendicular to a major surface of the substrate, wherein the plurality of electrodes comprises first, second, third and fourth electrodes, wherein the plurality of openings comprises first, second, third and fourth openings overlapping the first, second, third and fourth electrodes, respectively, when viewed in a viewing direction perpendicular to the major surface, wherein the first, second, third and fourth openings comprise first, second, third and fourth corners, respectively, wherein the first, second, third and fourth corners neighbor one another when viewed in the viewing direction; forming a spacer over the pixel defining layer, wherein, when viewed in the viewing direction, the spacer comprises at least a portion placed within an imaginary polygon defined by the first, second, third and fourth corners; and forming an organic light emission layer by depositing an organic light emission material in each opening, wherein the forming of the spacer comprises: forming a receiving groove on the pixel defining layer; applying a spacer forming material on the pixel defining layer; and making the spacer reflow to fill the spacer forming material in the receiving groove.

In the foregoing method, while reflowing the spacer, a boundary of the spacer may be rounded. The plurality of electrodes may further comprise fifth and sixth electrodes, wherein the plurality of openings comprise fifth and sixth openings overlapping the fifth and sixth electrodes, respectively, when viewed in the viewing direction, wherein the device comprises first and second pixels, each of which comprises first, second and third sub-pixels, the first, second and third sub-pixels configured to emit colored light having colors different from one another, wherein the first, third and fifth openings belong to the first, second and third sub-pixels of the first pixel, respectively, wherein the second, fourth and sixth openings belong to the first, second and third sub-pixels of the second pixel, respectively, wherein the first, second, fifth and sixth openings are arranged such that their long sides are substantially parallel to each other when viewed in the viewing direction, wherein the third and fourth openings are arranged such that their long sides are substantially aligned to an imaginary straight line when viewed in the viewing direction, wherein the first and fourth corners are diagonally disposed and the second and third corners are diagonally disposed.

An embodiment of the present invention provides an organic light emitting diode display, including: a substrate; a plurality of electrodes positioned on the substrate and including a first electrode, a second electrode, and a third electrode; a pixel defined layer positioned on the plurality of electrodes and including a plurality of openings through which the plurality of electrodes are each exposed; and a spacer positioned on the pixel defined layer, wherein the pixel defined layer includes a first pixel and a second pixel, the first pixel and the second pixel each includes: a first opening disposed along a first direction and having the first electrode exposed therethrough; a second opening disposed to be spaced apart from the first opening along the first direction and having the second electrode exposed therethrough; and a third opening disposed to be spaced apart from the first opening and the second opening, respectively, along a second direction intersecting the first direction and having a third electrode exposed therethrough, and the spacer is disposed in an area which is formed to abut to one corner of the first opening of the first pixel, one corner of the second opening of the second pixel, one corner of the third opening of the first pixel, and one corner of the third opening of the second pixel, respectively.

The pixel defined layer may further include a receiving groove which is formed along a boundary abut to the pixel defined layer by the spacer to receive a portion of the material forming the spacer.

The first opening, the second opening, and the third opening each may have a rectangular shape which is defined by a pair of sides disposed in parallel along the first direction and another pair of sides disposed in parallel along the second direction.

The spacer may include a radial center and a smaller angle among angles formed by a straight line extending from the radial center and each boundary among the first opening, the second opening, and the third opening may be from above 0° to under 90°.

The radial center may be the center of gravity of a cross section in which the spacer is cut in a direction parallel with the substrate.

The first opening, the second opening, and the third opening may each include a plurality of corners which are formed in a curved line.

The cross section in which the spacer is cut in a direction parallel with the substrate may be any one of a polygon, a circle, a semicircle, and an oval.

The cross section may be a trapezoidal shape having a pair of sides parallel with the second direction.

The area may be formed on the pixel defined layer in any one of a polygon, a circle, a semicircle, and an oval.

A boundary of the spacer may externally contact, match, or internally contact a boundary of the area or be completely included in the area.

The spacer may be disposed in pair to face each other with respect to a central axis of the third opening formed in a direction parallel with the second direction.

The spacer may be formed in plural and may have different cross section shapes in which the spacer is cut in a direction parallel with the substrate.

The spacer may be made of the same material as the pixel defined layer.

The first opening may be provided with a first emission layer deposited with a first organic emission material, the second opening may be provided with a second organic emission layer deposited with a second organic emission material, and the third opening may be provided with a third organic emission layer deposited with a third organic emission material.

An area of the third opening may be wider than that of the first opening and the second opening, respectively.

Another embodiment of the present invention provides a method for manufacturing an organic light emitting diode display, including: forming a plurality of electrodes including a first electrode, a second electrode, and a third electrode on a substrate; forming a pixel defined layer on the substrate and the electrode so that a plurality of openings are formed at positions corresponding to the plurality of electrodes, respectively, to expose the electrodes; forming a spacer in an area on the pixel defined layer which is formed to abut to one corner of a first opening of a first pixel, one corner of a second opening of a second pixel, one corner of a third opening of the first pixel, and one corner of a third opening of the second pixel, respectively; and forming an organic emission layer by depositing an organic emission material in the opening, wherein the forming of the spacer includes: forming a receiving groove along a boundary of a position corresponding to the shape of the spacer which is formed on the pixel defined layer; applying a material forming the spacer; and making the spacer reflow to fill the material forming the spacer in the receiving groove.

In the reflowing of the spacer, a boundary of the spacer may be rounded.

According to an embodiment of the present invention, it is possible to provide the organic light emitting diode display and the method for manufacturing the same capable of remarkably reducing the possibility of invading the debris of the damaged spacer into the opening of the pixel defining layer even though the spacer is damaged by the external impact to prevent the occurrence of defects of products, thereby remarkably reducing the occurrence rate of defects of products.

DETAILED DESCRIPTION OF EMBODIMENTS

Hereinafter, embodiments of the present invention will be described in detail with reference to the drawings. However, in describing embodiments of the present invention, the description of well-known functions or constructions will be omitted to make a gist of the present invention clear.

Hereinafter, an organic light emitting diode display according to an embodiment of the present invention will be described with reference to the accompanying drawings.

In embodiments, an organic light emitting diode display includes a first substrate, a plurality of pixel circuits, each including at least a thin film transistor, a plurality of pixels, each including a first electrode connected to a corresponding pixel circuit, a pixel definition layer having a plurality of openings through which a corresponding first electrode is exposed, and a plurality of spacers disposed on the pixel definition layer. Each pixel further includes an organic light emission layer disposed on or over the first electrode within the opening and a second electrode disposed on or over the organic light emission layer. A second substrate is disposed on or over the second electrode.

In the above organic emitting diode display, the spacer is disposed in a space between the plurality of openings which are set by the pixel definition layer and may serve to support a deposition mask during a process of depositing an organic material using the deposition mask. However, when the spacer is damaged due to an impact in a direction perpendicular to a display surface of the organic light emitting diode display, debris of the damaged spacer invades the opening to cover an electrode exposed through the opening, thereby causing defects of the organic light emitting diode display and a reduction in performance.

Figure 1:
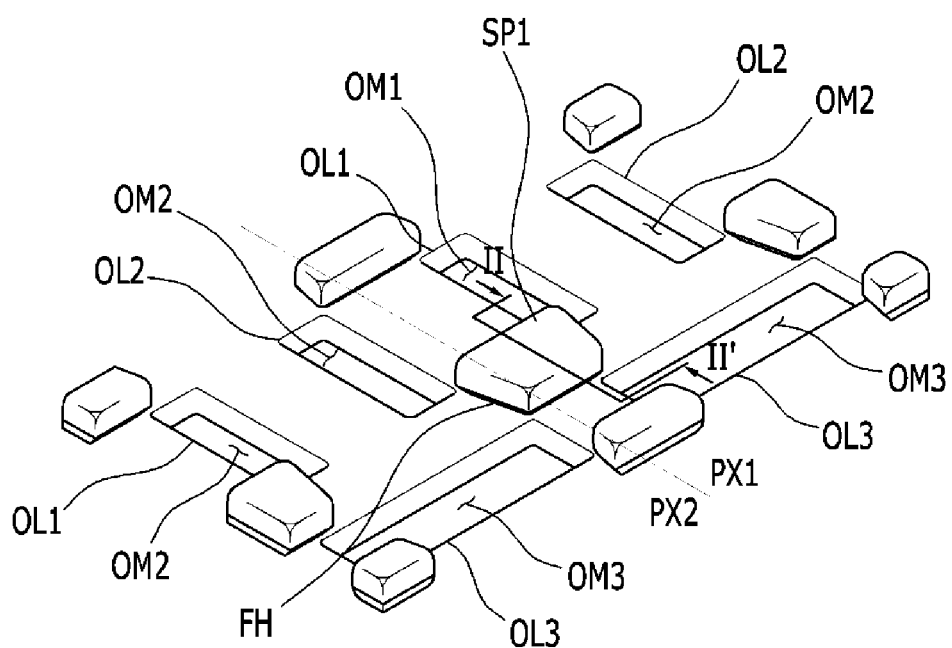
FIG. 1 is a diagram illustrating an organic light emitting diode display according to an embodiment of the present invention.
Figure 2:
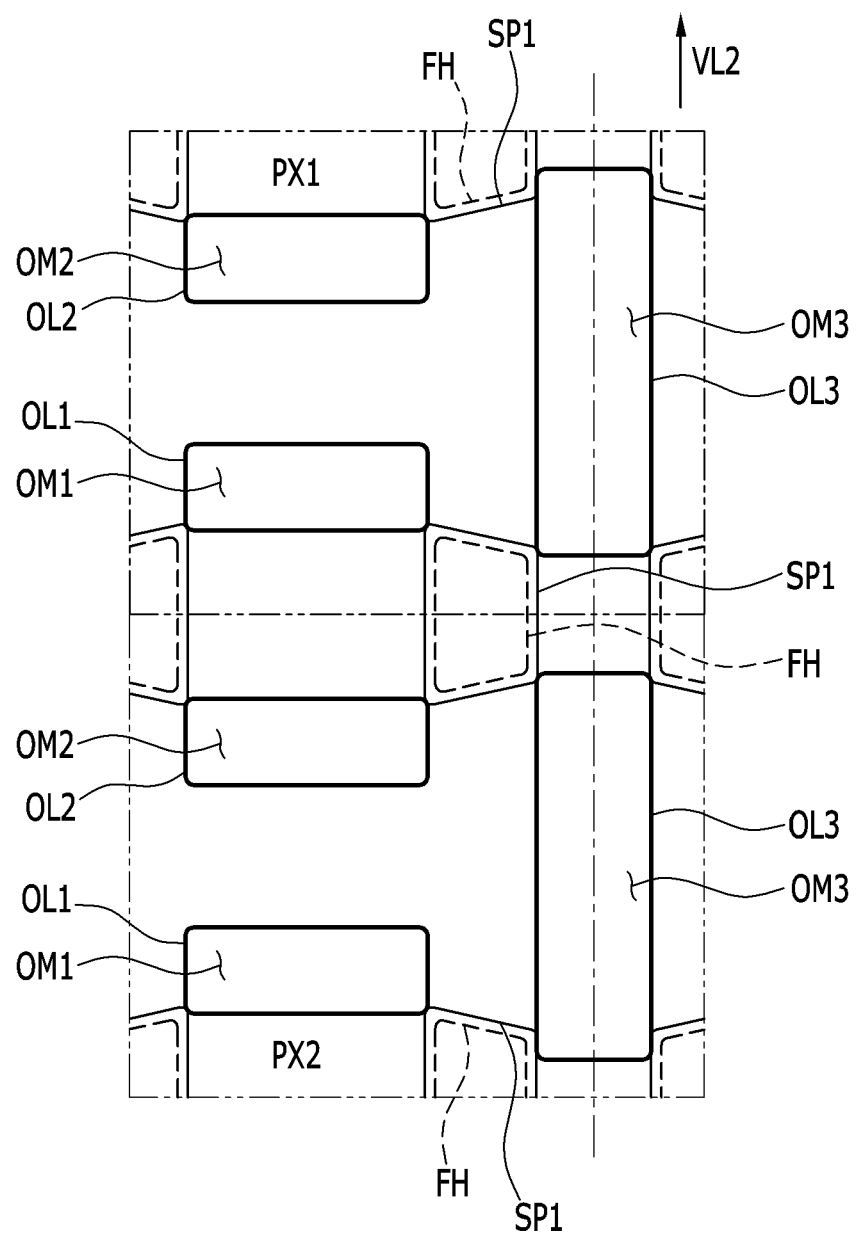
FIG. 2 is a plan view of the organic light emitting diode display of FIG. 1.
Figure 3:
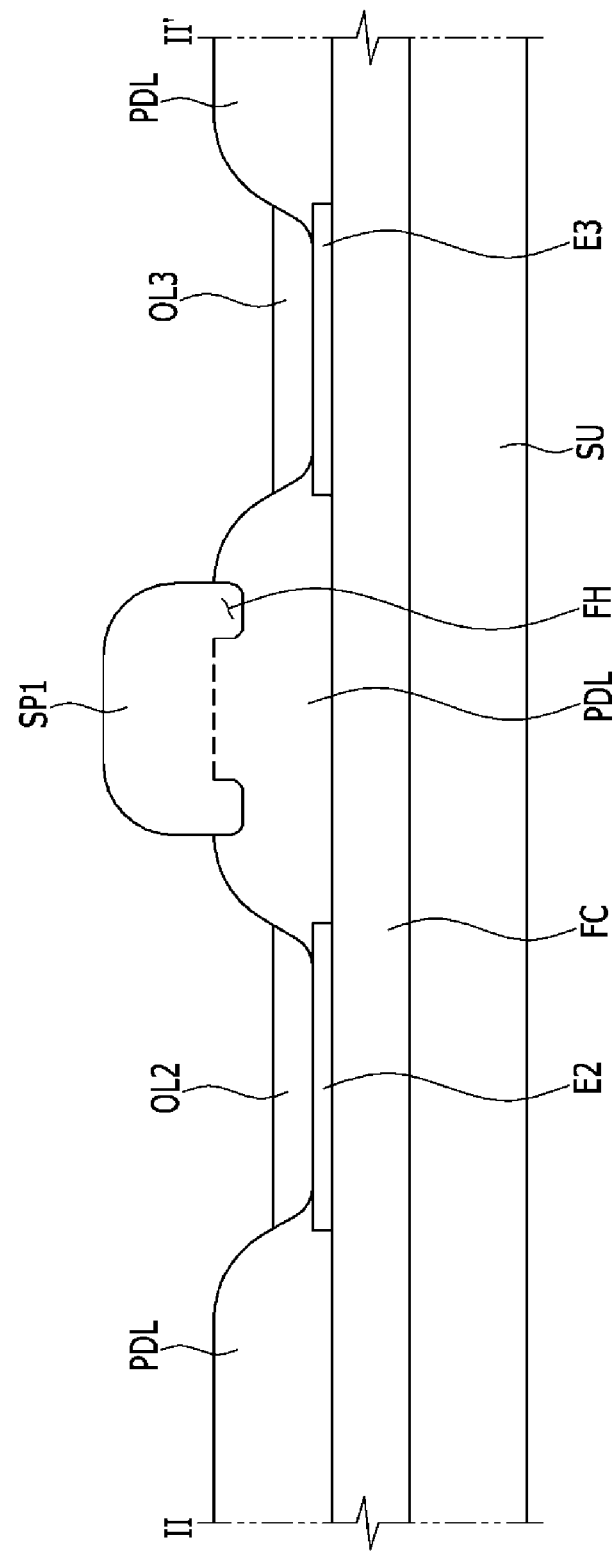
FIG. 3 is a cross-sectional view taken along the line II-II' of FIG. 1.

FIG. 1 is a diagram illustrating an organic light emitting diode display in which a spacer SP1 according to an embodiment of the present invention is formed, FIG. 2 is a plan view of the organic light emitting diode display of FIG. 1, and FIG. 3 is a cross-sectional view taken along the line II-II' of FIG. 1.

Figure 4:
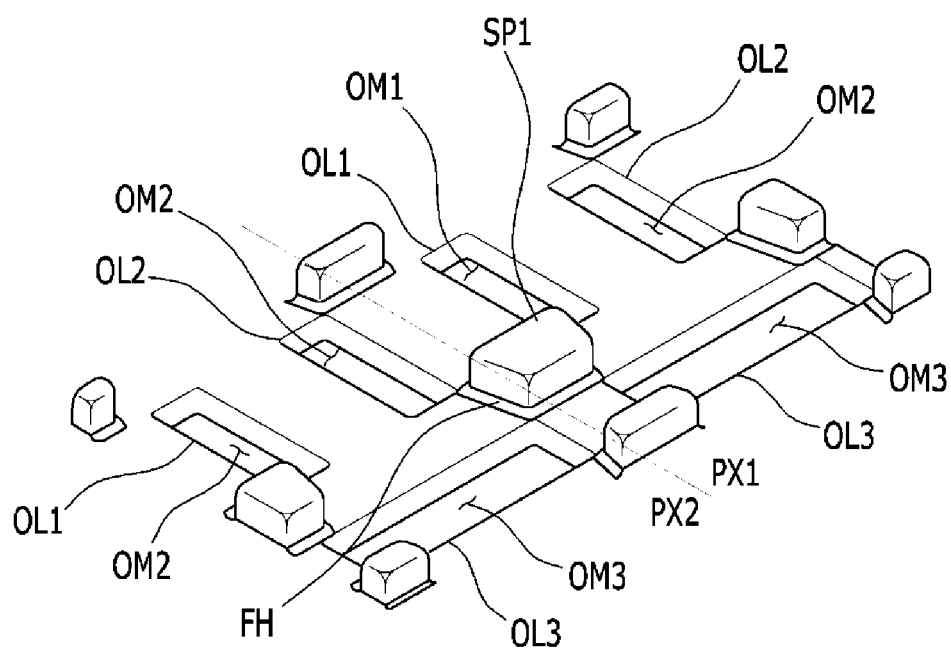
FIG. 4 is a diagram illustrating an appearance before the organic light emitting diode display of FIG. 1 reflows.
Figure 5:
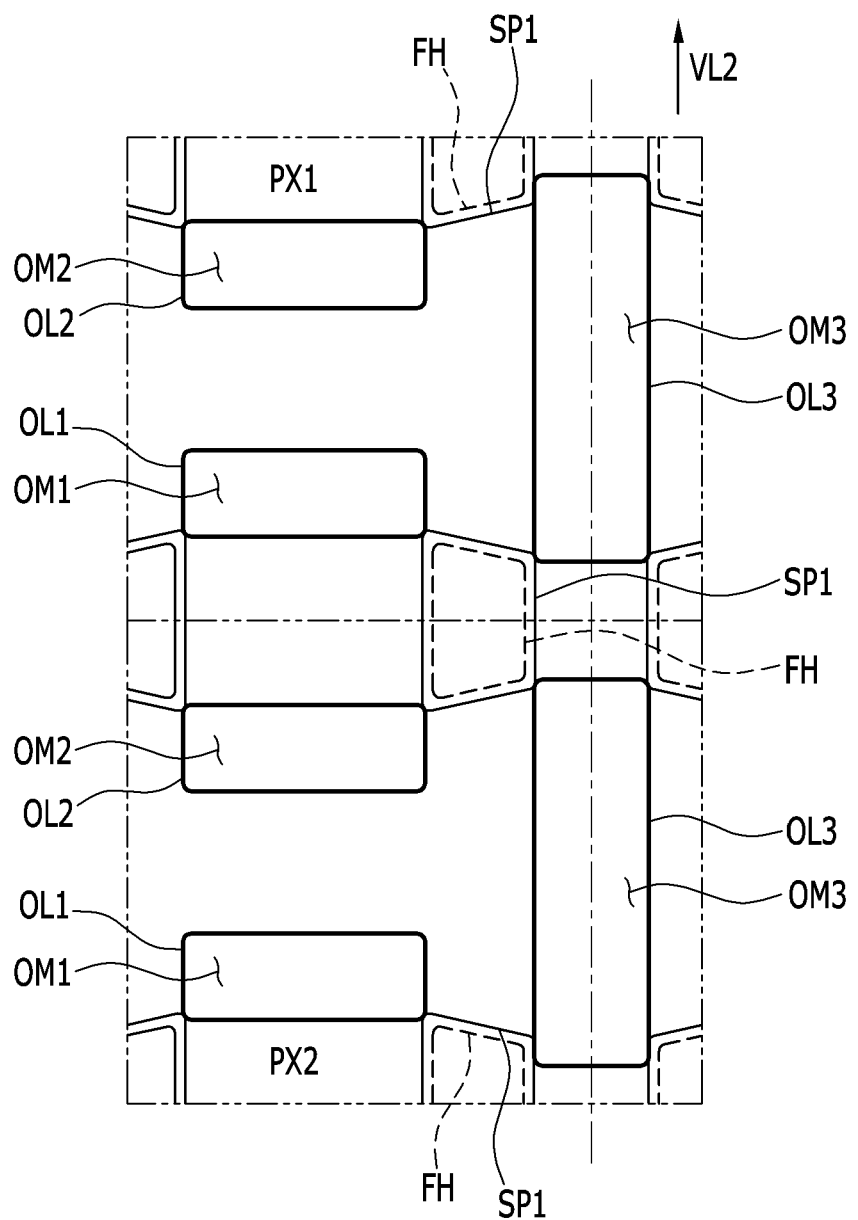
FIG. 5 is a plan view of the organic light emitting diode display of FIG. 4.

FIG. 4 is a diagram illustrating an appearance before the organic light emitting diode display of FIG. 1 reflows and FIG. 5 is a plan view of the organic light emitting diode display of FIG. 4.

According to an embodiment of the present invention, an organic light emitting diode display which includes a substrate SU, electrodes E1, E2, and E3, a pixel defining layer PDL, and the spacer SP1 is provided.

The substrate SU is a base of the organic light emitting diode display according to the embodiment of the present invention and may be made of hard materials such as ceramic of glass, etc., metal, and synthetic resin or soft materials such as polyimide (PI). Therefore, the scope of the embodiment of the present invention is not limited by various physical properties such as a kind, a property, and a material of substrate (SU).

The electrodes E1, E2, and E3 are disposed on or over the substrate SU and receive electrical signals to transfer electrons or holes to organic emission layers OL1, OL2, and OL3, thereby operating the organic light emitting diode display.

The electrode may include metal, oxides such as indium tin oxide (ITO), and materials such as carbon nanotube (CNT) but the embodiment of the present invention is not limited thereto. Therefore, any material through which electricity may be conducted may be included in the scope of the present invention.

The electrodes E1, E2, and E3 according to the embodiment of the embodiment of the present invention may be formed in plural, including a first electrode E1, a second electrode E2, and a third electrode E3. In embodiments, each of the plurality of pixels of the display may include first, second and third sub-pixels which include the first electrode E1, the second electrode E2, and the third electrode E3, respectively. The first, second and third sub-pixels emit colored light having colors different from one another.

In embodiment, the first electrode E1, the second electrode E2, and the third electrode E3 according to the embodiment of the present invention may each be an anode which serves as a hole injection electrode or a cathode which serves as an electron injection electrode. The first electrode E1, the second electrode E2, and the third electrode E3 may be formed as a light transmitting electrode, a light transflective electrode, or a light reflective electrode.

A circuit layer FC may be formed between the substrate SU and the electrodes E1, E2, and E3 according to the embodiment of the present invention. To transfer the electrical signals to the electrode, the circuit layer FC may include a wiring which includes at least one scan line, a data line, a driving power supply line, a common power supply line and the like, a pixel circuit which includes at least two thin film transistors (TFTs) and at least one capacitor connected to the wiring corresponding to each pixel, and the like. In addition, the circuit layer FC may have known various structures and the configuration of the circuit layer FC does not limit the scope of the present invention.

The pixel defining layer (PDL) is disposed on or over the plurality of electrodes and includes a plurality of openings OM1, OM2, and OM3 covering edges of the plurality of electrodes, respectively, to expose each electrode. In embodiments, the plurality of pixels includes a first pixel PX1 and a second pixel PX2. For each of the first pixel PX1 and the second pixel PX2, the pixel defining layer (PDL) according to the embodiment of the present invention includes the first opening OM1, the second opening OM2, and the third opening OM3. In embodiments, each opening may be a hole which receives an organic light emission material and other materials. In other embodiments, each opening may be a trench which receives an organic light emission material and other materials.

The first opening OM1 is disposed along a first direction VL1 and exposes the first electrode E1. The first opening OM1 according to the embodiment of the present invention may be deposited with a first organic emission material to form a first organic emission layer OL1. In embodiments, the first organic emission layer OL1 of the first opening OM1 according to the embodiment of the present invention may be formed by being deposited with the organic emission material representing any one of red and green by excitons formed by a combination of electrons and holes when a voltage or a current is applied to the electrodes corresponding to each organic emission layer OL1, OL2, and OL3, but the embodiment of the present invention is not limited thereto, and therefore it may be formed by an organic emission material representing any one of blue and white.

The second opening OM2 is spaced apart from the first opening OM1 along the first direction VL1 and exposes the second electrode E2. The second opening OM2 according to the embodiment of the present invention may be deposited with a second organic emission material to form the second organic emission layer OL2. In embodiments, the second organic emission layer OL2 of the second opening OM2 according to the embodiment of the present invention may be formed by being deposited with the organic emission material representing one color different from the first organic emission layer OL1 between red and green by excitons formed by a combination of electrons and holes when a voltage or a current is applied to the electrodes corresponding to each organic emission layer OL1, OL2, and OL3, but the embodiment of the present invention is not limited thereto, and therefore it may be formed by an organic emission material representing one color different from the first organic emission material among colors including blue or white.

The third opening OM3 is spaced apart from the first opening OM1 and the second opening OM2, respectively, along the second direction VL2 intersecting the first direction VL1 and exposes the third electrode E3. The third opening OM3 according to the embodiment of the present invention may be deposited with a third organic emission material to form the third organic emission layer OL3. In embodiments, the third organic emission layer OL3 of the third opening OM3 according to the embodiment of the present invention may be formed by being deposited with the organic emission material representing blue by excitons formed by a combination of electrons and holes when a voltage or a current is applied to the electrodes corresponding to each organic emission layer OL1, OL2, and OL3, but the embodiment of the present invention is not limited thereto, and therefore it may be formed by an organic emission material representing any one of red, green and white.

Meanwhile, the third opening OM3 formed with the third organic emission layer OL3 representing a blue color according to the embodiment of the present invention may have an area wider than that of the first opening OM1 and the second opening OM2.

In addition thereto, the opening including the organic emission layer representing a white color by being formed with a fourth opening may be further provided and the scope of the present invention is not limited thereto.

Each organic emission layer (first organic emission layer OL1, second organic emission layer OL2, and third organic emission layer OL3) according to the embodiment of the present invention is formed at a portion substantially deposited with the organic emission material through an opening of a mask and when the electrodes corresponding to each organic emission layer OL1, OL2, and OL3 are applied with voltage or current, they emit light with a predetermined color.

However, each organic emission material (first organic emission material, second organic emission material, third organic emission material) is deposited through the opening of the mask and is thus deposited at the position corresponding to the opening of the mask. Therefore, each organic emission material may be deposited to have an area wider than that of the openings OM1, OM2, and OM3 of the pixel defining layer (PDL) and the organic emission material may also be positioned on or over the pixel defining layer (PDL) and the spacer SP1 to be described below. However, in the drawings and the detailed description for describing the embodiment of the present invention, a portion at which the organic light emission material is deposited and will emit light depending on the application of voltage or current is defined as the organic emission layers OL1, OL2, and OL3.

The spacer SP1 may support the deposition mask while each organic emission material corresponding to each opening OM1, OM2, and OM3 is deposited and may support components which are formed at an upper portion even when the following processes are performed.

The spacer SP1 according to the embodiment of the present invention is disposed in the areas AR1 and AR2 which are each abut to one corner of the first opening OM1 of the first pixel PX1, one corner of the second opening OM2 of the second pixel PX2, one corner of the third opening OM3 of the first pixel PX1, and one corner of the third opening OM3 of the second pixel PX2.

In embodiments, when defining two-dimensionally in the detailed description of the present application, a 'corner' may include an intersecting point or portion of two side lines forming the boundary of each of the openings OM1, OM2, and OM3 when viewing the first opening OM1, the second opening OM2, and the third opening OM3, respectively, in a vertical direction to the substrate SU. Alternatively, defining three-dimensionally, corners on two dimension mean intersecting points which are formed by three-dimensionally intersecting each other. In one embodiment, each opening may include a sharp corner when viewed in a viewing direction perpendicular to a major surface of the substrate. In another embodiment, each opening may include a rounded corner when viewed in the viewing direction.

However, the embodiment of the present invention is not limited thereto. In alternative embodiments, the areas AR1 and the AR2 do not abut to any one of the foregoing four corners. Further, even the case in which the areas AR1 and AR2 are formed by each connecting the second opening OM2 and the third opening OM3 of the first pixel PX1 and the first opening OM1 and the third opening OM3 of the second pixel PX2 may be easily derived from the embodiment of the present invention, which may be included in the scope of the present invention.

Figure 6:
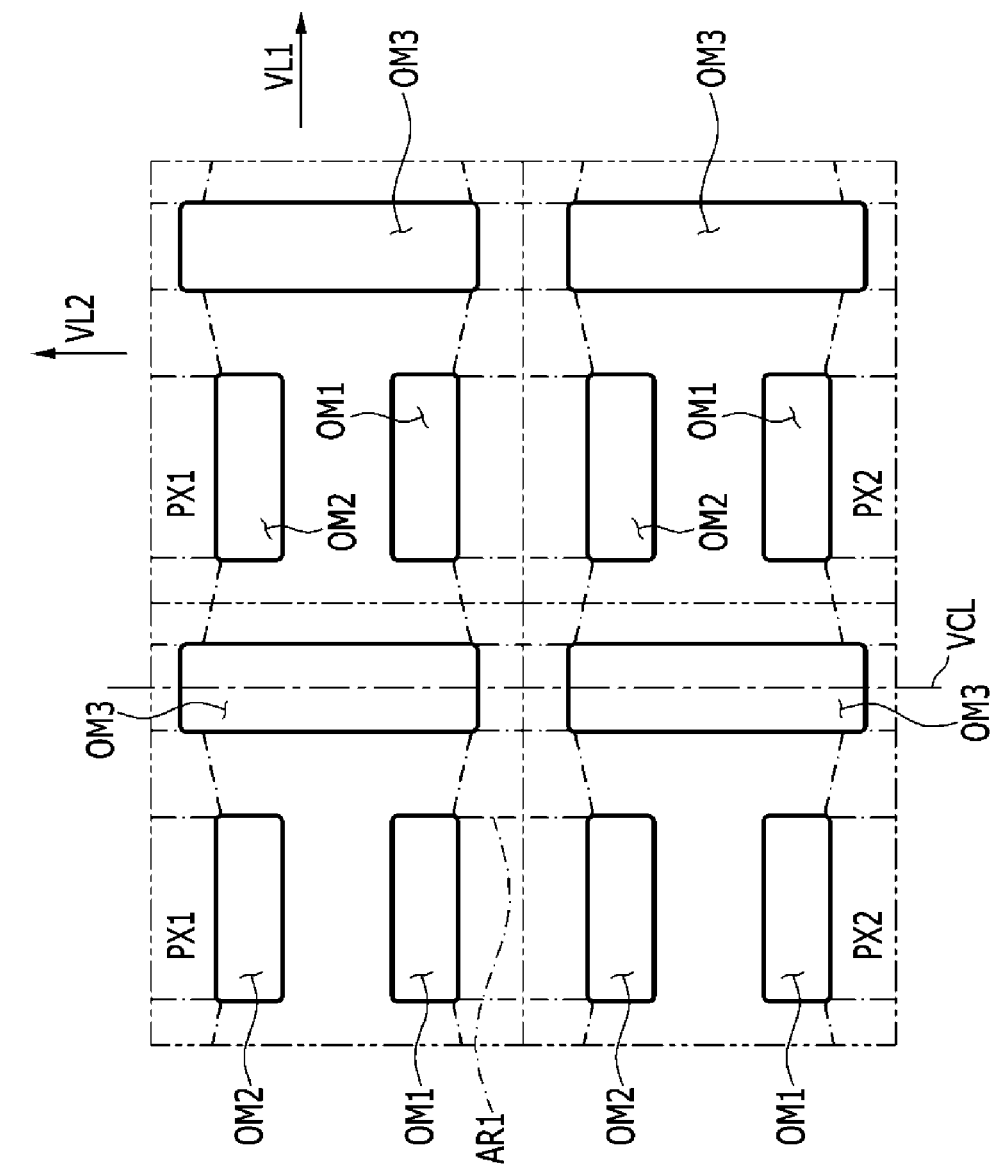
FIG. 6 is a diagram illustrating an area in which a spacer according to an embodiment of the present invention may be formed.
Figure 7:
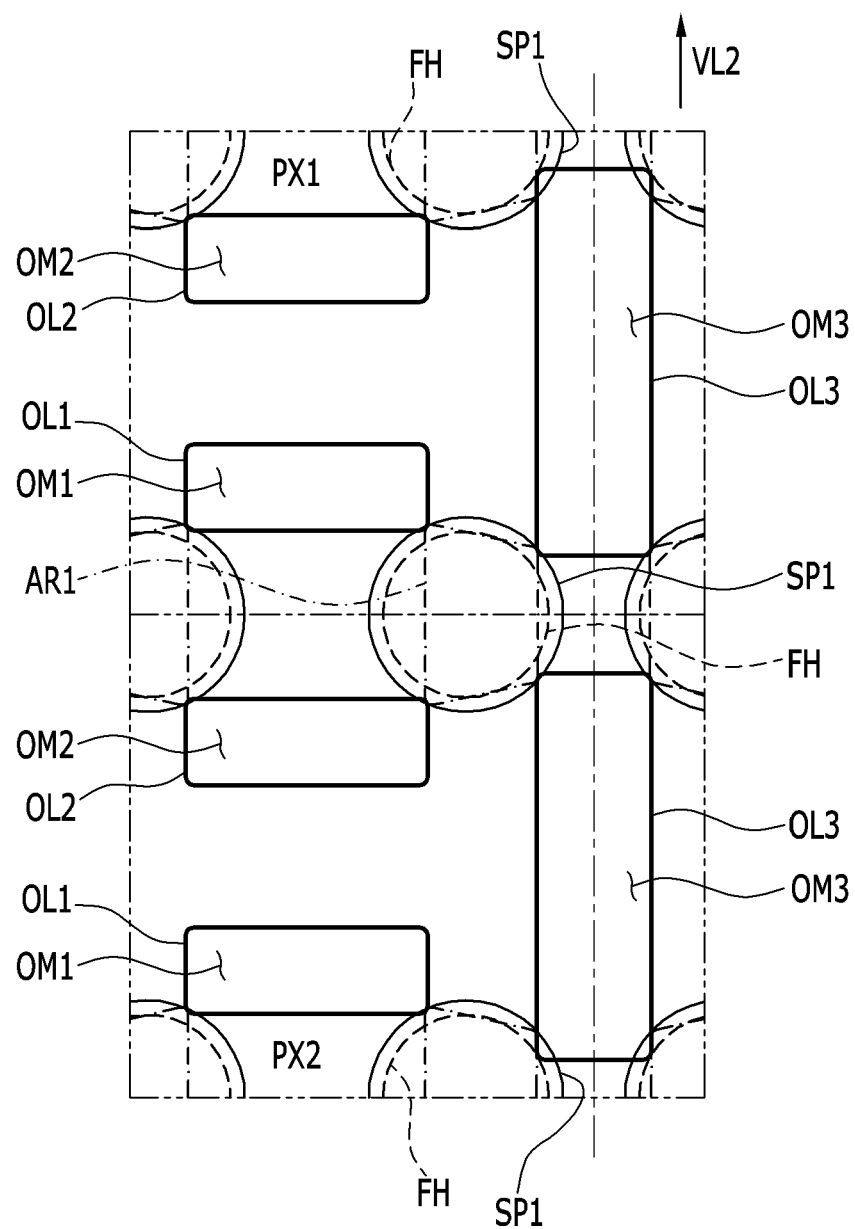
FIGS. 7 to 10 are diagrams illustrating variously modified examples of the spacer.
Figure 8:
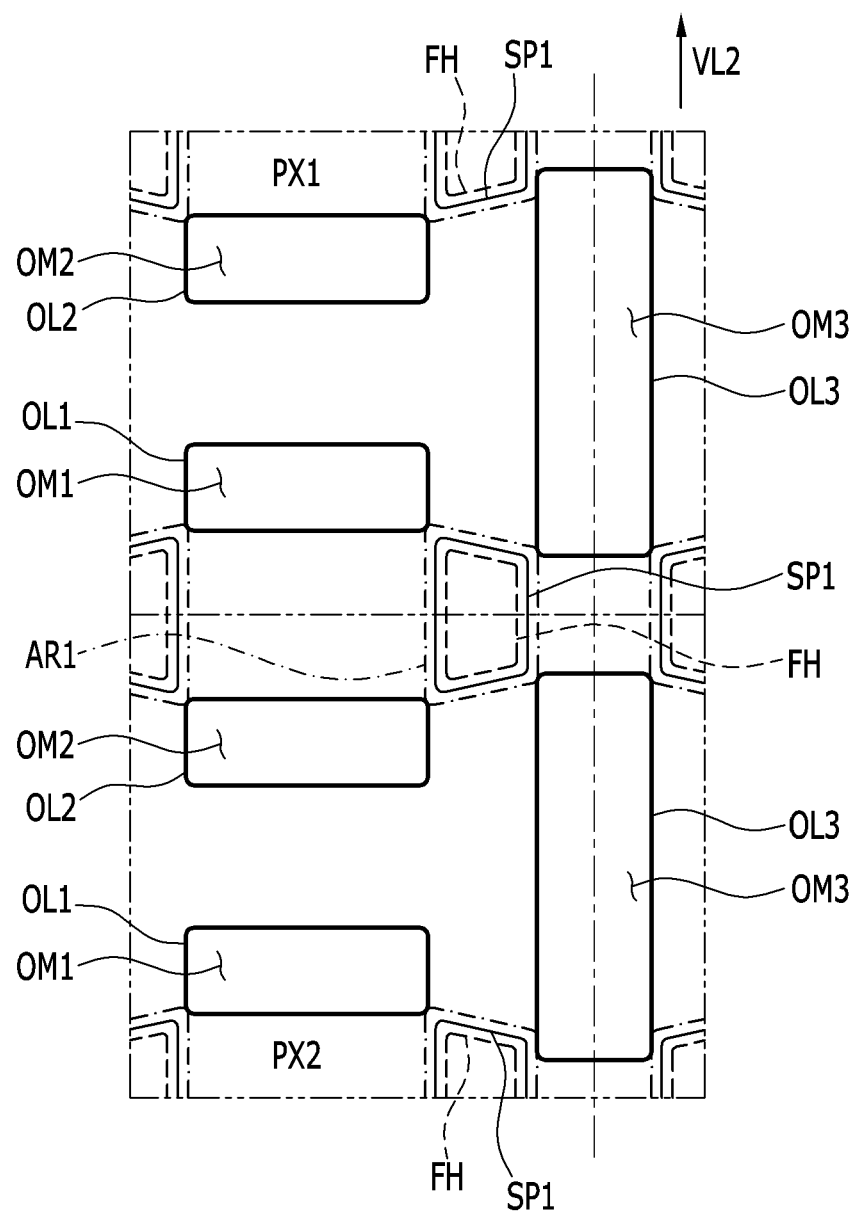
Figure 9:
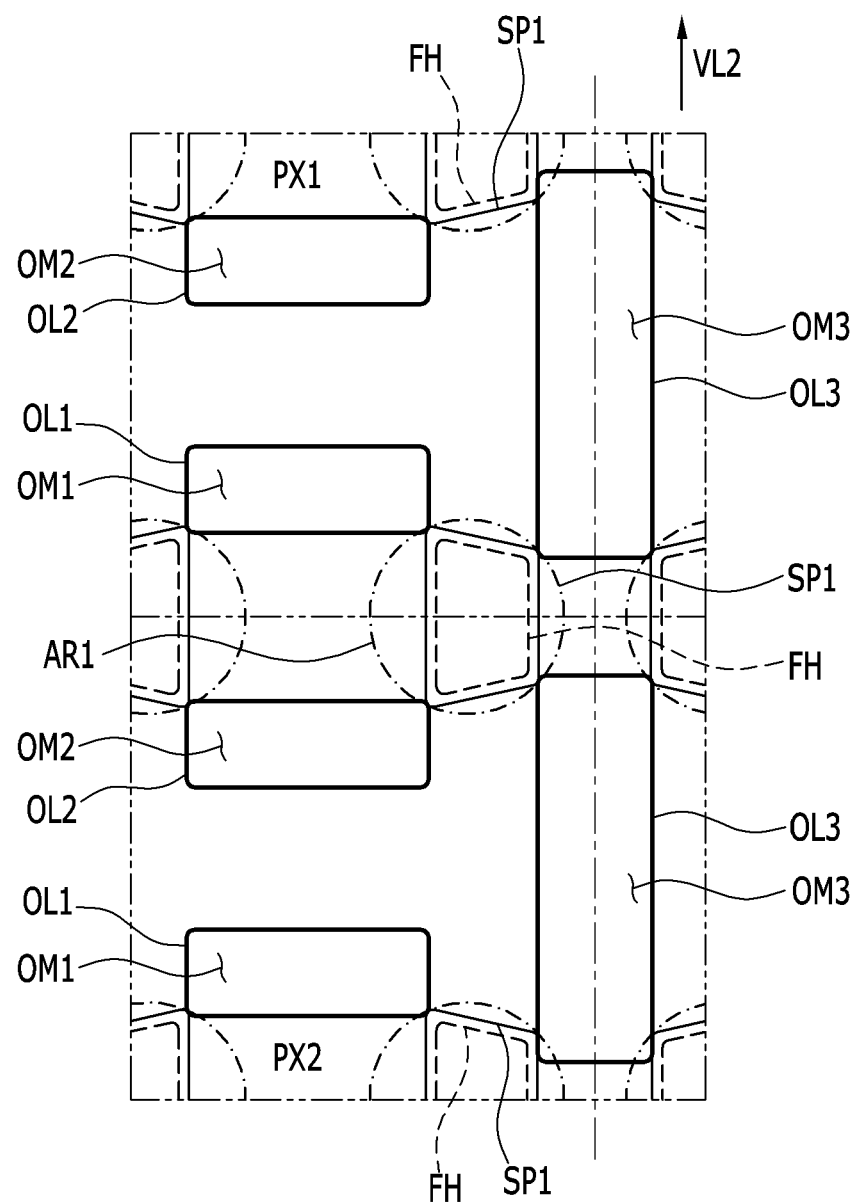
Figure 10:
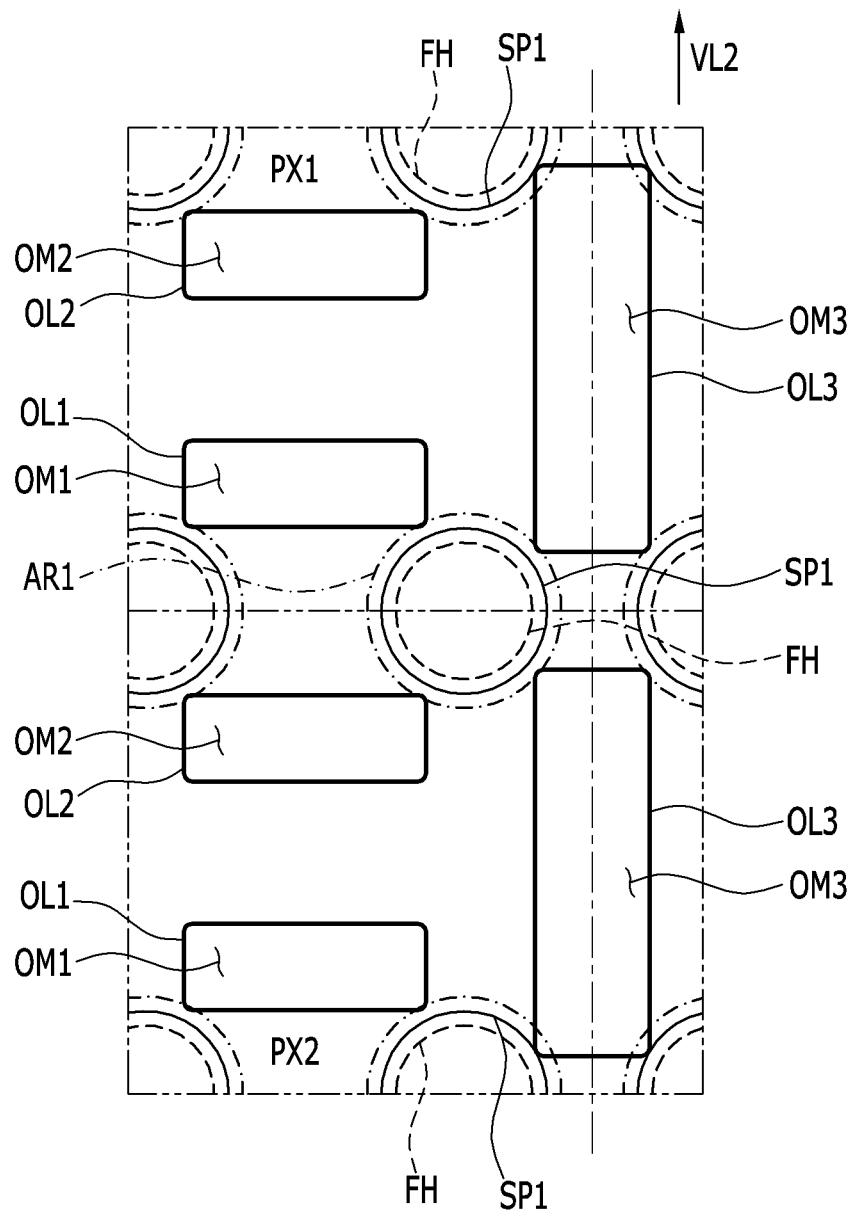

FIG. 6 illustrates that in the organic light emitting diode display according to the embodiment of the present invention, the areas AR1 and AR2 in which the spacer SP1 may be formed are represented on the pixel defining layer (PDL) and FIGS. 7 to 10 are diagrams illustrating variously modified examples of the spacer and the area.

The areas AR1 and AR2 may be a polygon such as a quadrangle as illustrated in FIG. 6 but are not limited thereto and therefore may be formed in any one shape of a circle, a semicircle, and an oval. Further, these shapes are only examples for describing various embodiments of the present invention and therefore any shape which may be implemented two dimensionally or three dimensionally or the areas AR1 and AR2 for forming the spacer SP1 at the same or similar position to achieve the same or similar purpose as or to the present invention may be allowable, which does not limit the scope of the present invention.

In embodiments, the pixel defining layer (PDL) according to the embodiment of the present invention may further include a receiving groove FH.

The receiving groove FH is a groove formed along a boundary to which the spacer SP1 abuts to the pixel defining layer (PDL) in an opposite direction to a direction in which the spacer SP1 is formed based on the pixel defining layer (PDL). Therefore, a portion of the spacer SP1 may be received in a portion or all of the receiving groove FH by a process of making the spacer SP1 reflow.

FIGS. 4 and 5 illustrate an appearance of the spacer SP1 before the reflow process is performed and FIGS. 1 to 3 illustrate an appearance of the spacer SP1 after the reflow process is performed.

As illustrated in FIGS. 4 and 5, the spacer SP1 is formed to expose the receiving groove FH to the outside before the reflow process is performed, but when the reflow process is performed, as illustrated in FIGS. 1 to 3, the spacer SP1 may be filled in the receiving groove FH.

Therefore, the boundary of the spacer SP1 according to the embodiment of the present invention may be defined by the shape of the receiving groove FH and the spacer SP1 maintain its own shape by not being melted or flowing along the surface of the pixel defining layer (PDL) at the time of performing the reflow process and being received in a portion or all of the receiving groove FH.

The first opening OM1, the second opening OM2, and the third opening OM3 according to the embodiment of the present invention may each have a rectangular shape which is defined by a pair of sides disposed in parallel along the first direction VL1 and another pair of sides disposed in parallel along the second direction. Here, "disposed in parallel" does not mean complete parallelism, but parallelism enough to be determined as being parallel at a generally recognized level may be included in the scope of the present invention.

Meanwhile, FIGS. 7 to 10 illustrate the area AR1 and the spacer SP1 according to various embodiments of the present invention.

As illustrated in FIGS. 7 to 10, a cross section of the spacer SP1 according to the embodiment of the present invention which is cut in a parallel direction with the substrate SU may be a polygon such as a quadrangle, a pentagon, and a hexagon or any one of a circle, a semicircle, and an oval.

Further, the spacer SP1 according to the embodiment of the present invention externally contacts, matches, or internally contacts a boundary of the area AR1 which abuts to one corner of the first opening OM1 of the first pixel PX1, one corner of the second opening OM2 of the second pixel PX2, one corner of the third opening OM3 of the first pixel PX1, and one corner of the third opening OM3 of the second pixel PX2, respectively, or is completely included in the area AR1, thereby preventing the boundary of the area AR1 and the boundary of the spacer SP1 from intersecting each other.

Therefore, as illustrated in the foregoing contents and each drawing, in embodiments, the shape of the cross section may be freely changed as long as the spacer SP1 according to the embodiment of the present invention may be formed in the area AR1 which abuts to one corner of the first opening OM1 of the first pixel PX1, one corner of the second opening OM2 of the second pixel PX2, one corner of the third opening OM3 of the first pixel PX1, and one corner of the third opening OM3 of the second pixel PX2. The intersection of the spacer SP1 with the area AR1 may be included in the scope of the present invention, regardless of whether a portion of the spacer SP1 intersects the area AR1 or is completely included in the corresponding area AR1. Further, in addition to embodiments which are described and illustrated in the detailed description of the present invention, there may be variously modified examples which may be included in the scope of the present invention.

As one of the embodiments of the present invention, FIG. 2 illustrates that the boundary of the area AR1 matches the boundary of the spacer SP1 while abutting to the first opening OM1 and the third opening OM3 of the first pixel PX1, the second opening OM2 and the third opening OM3 of the second pixel PX2, respectively, and the spacer SP1 having a trapezoidal cross section in which a side which connects the first opening OM1 of the first pixel PX1 and the second opening OM2 of the second pixel PX2 and a side which connects the third opening OM3 of the first pixel PX1 and the third opening OM3 of the second pixel PX2 are disposed in parallel along the second direction VL2 is illustrated.

In embodiments, as described above, the first opening OM1, the second opening OM2, and the third opening OM3 may each have a rectangular shape.

An organic light emitting diode display according to another embodiment of the present invention includes a radial center (RC) which is formed at a center of the spacer SP1. In the detailed description of the present application, the "radial center (RC)" means a reference point which is a center radially extending from any one point.

Figure 11:
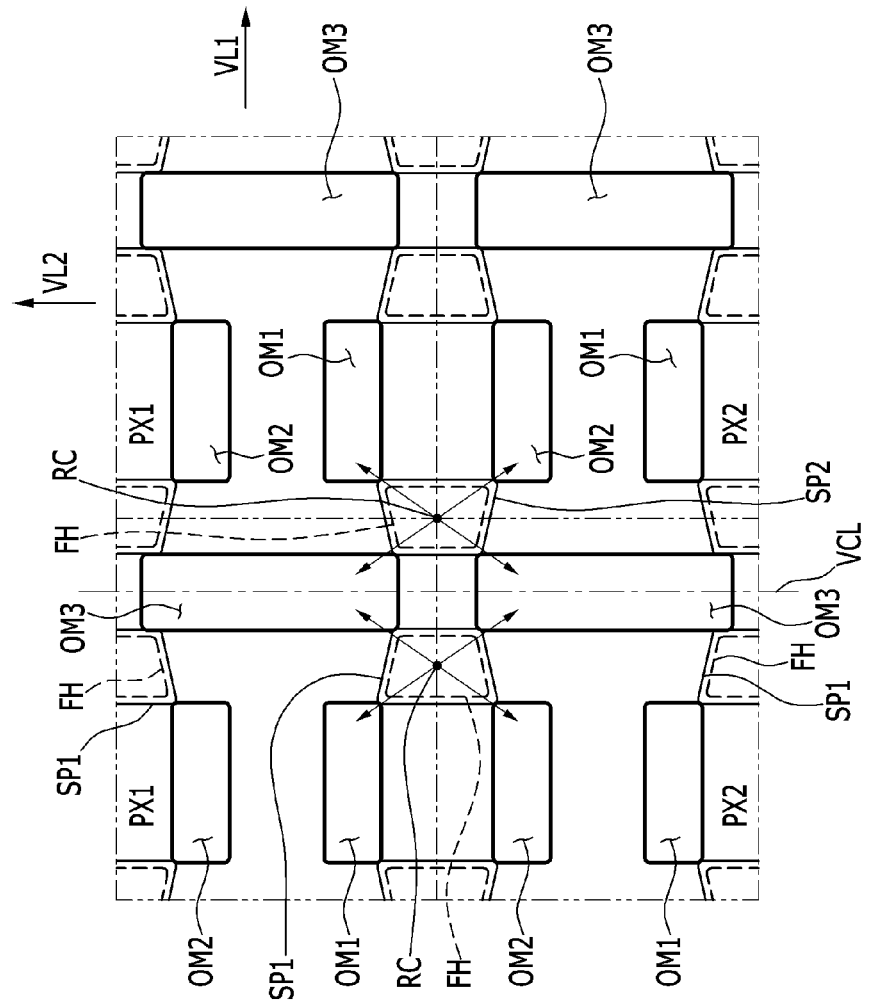
FIG. 11 is a diagram illustrating the spacer having a radial center according to the embodiment of the present invention.
Figure 12:
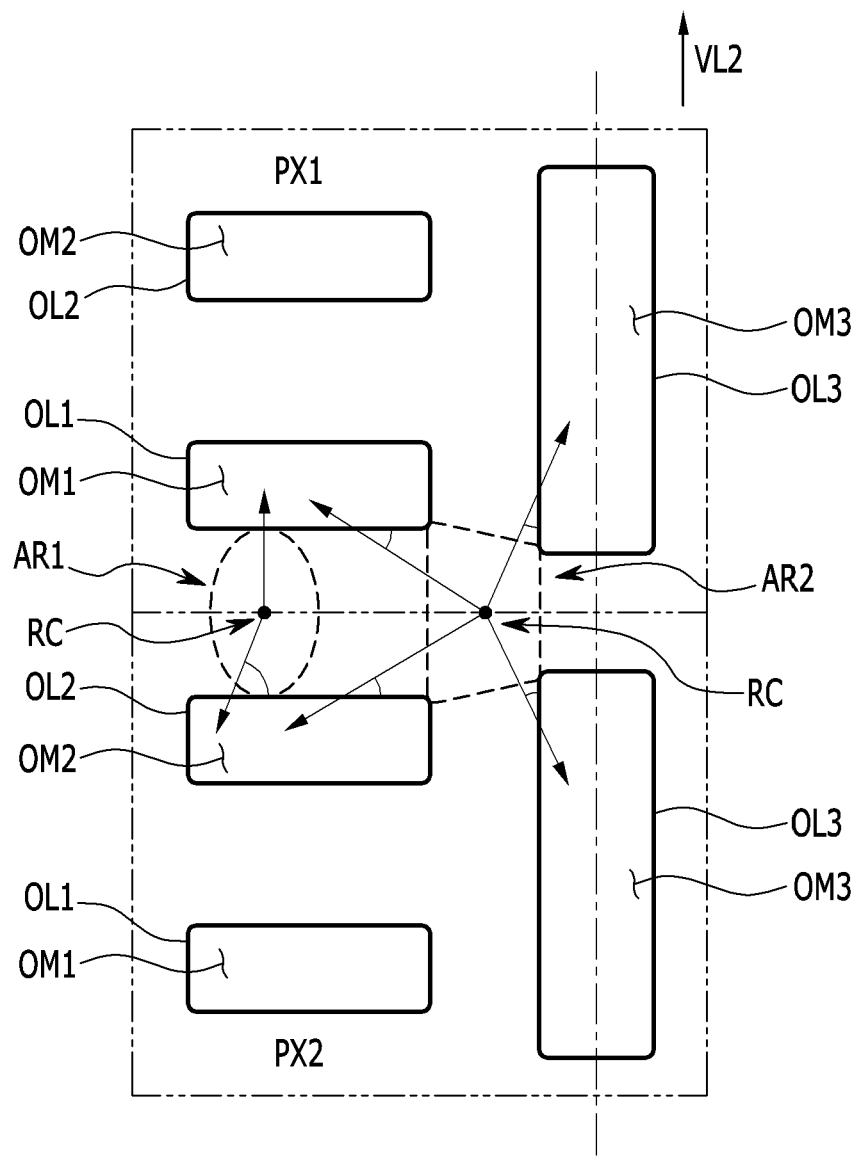
FIG. 12 is a diagram for describing the radial center according to the embodiment of the present invention.
Figure 13:
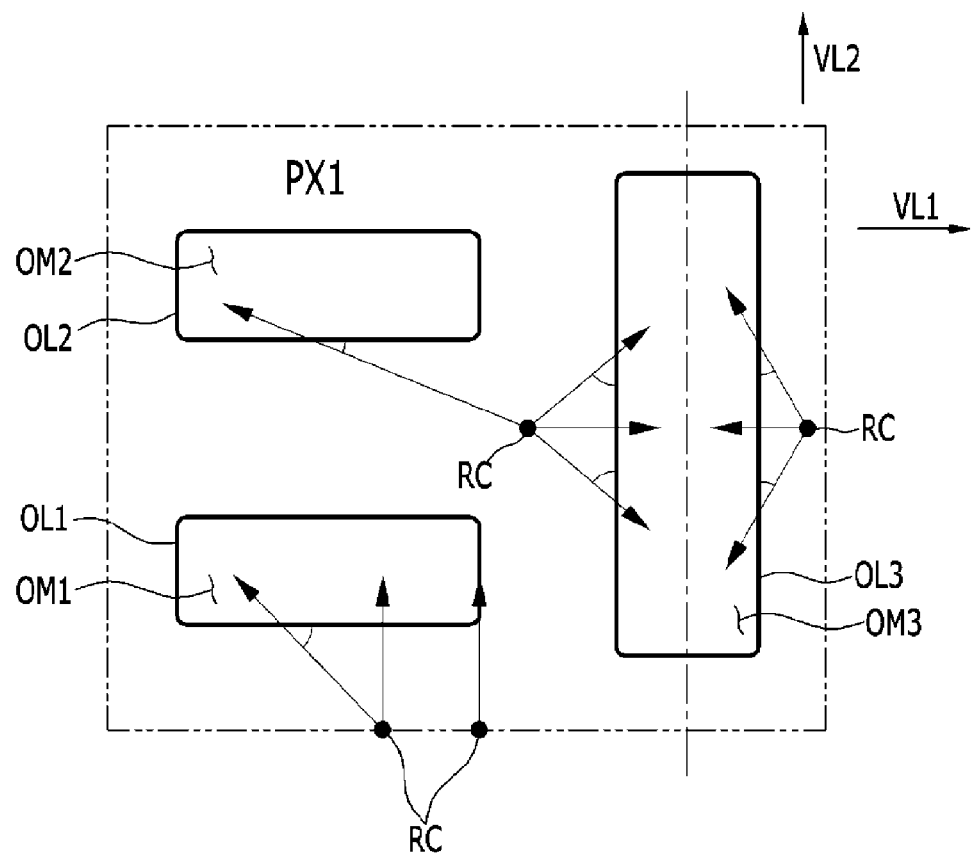
FIG. 13 is a diagram illustrating an example in which the radial center of the embodiment of the present invention may not be formed.
Figure 14:
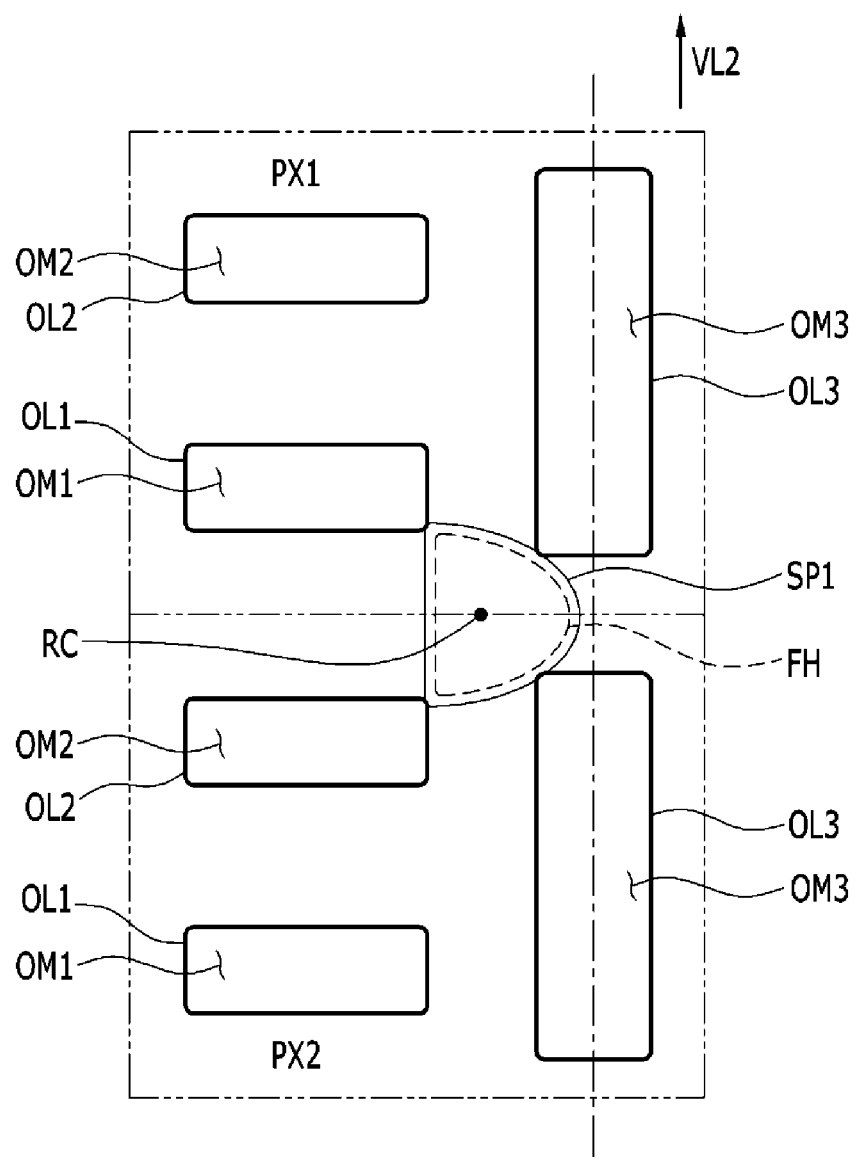
FIGS. 14 and 15 are diagrams illustrating variously modified examples of the spacer.
Figure 15:
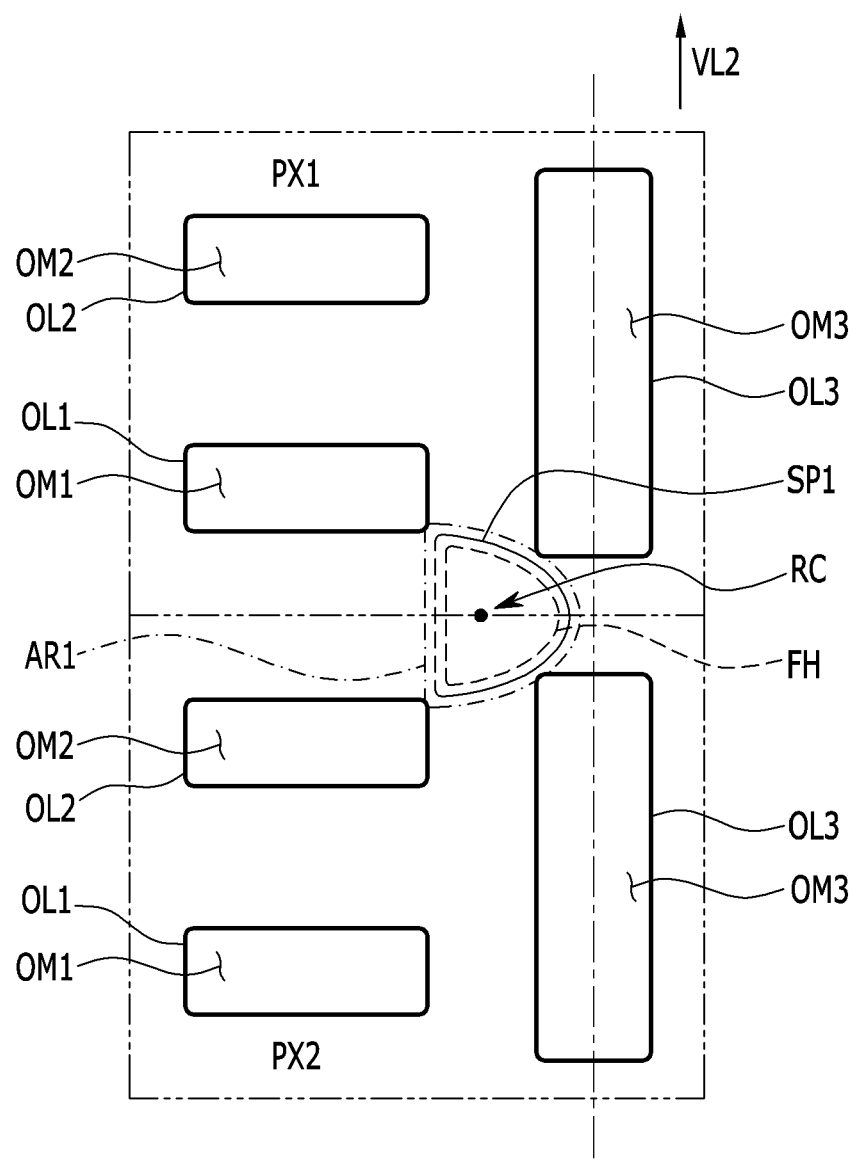

FIG. 11 is a diagram illustrating the spacer SP1 having the radial center (RC) according to the embodiment of the present invention and FIGS. 12 and 13 illustrate an example in which the radial center according to the embodiment of the present invention may be formed and an example in which the radial center according to the embodiment of the present invention may not be formed. FIGS. 14 and 15 illustrate that the spacer SP1 may have the radial center RC regardless of the shape and size of the area AR1 and the spacer SP1.

As illustrated in FIG. 11, according to the embodiment of the present invention, a smaller angle among angles formed by the boundaries of the first opening OM1, the second opening OM2, and the third opening OM3 from the radial center RC of the spacer SP1 may be from above 0° to under 90°

In the detailed description of the present application, the above angle is defined as an "incident angle". According to the embodiment of the present invention, the incident angle which is the smaller angle among angles formed by the boundaries of the first opening OM1, the second opening OM2, and the third opening OM3 from the radial center RC of the spacer SP1 may be from above 0° to under 90°.

Therefore, as partially illustrated in FIG. 12 and as illustrated in FIG. 13, when the incident angle is 0° or 90°, the radial center according to the embodiment of the present invention may not be formed. When the incident angle is 0° or 90° in any one direction among directions radially extending from the radial center RC, the spacer SP1 according to the embodiment of the present invention may not be disposed at the corresponding position.

Therefore, the radial center RC of the oval area AR1 in FIG. 12 or all the radial centers RCs illustrated in FIG. 13 include a point at which the incident angle to any one of the first opening OM1, the second opening OM2, and the third opening OM3 is 0° or 90° and therefore may not be the radial center according to the embodiment of the present invention.

The embodiment of the present invention is based on the fact that a pair of boundaries among the boundaries among the first opening OM1, the second opening OM2, and the third opening OM3, respectively, has a rectangular shape parallel with the first direction VL1 and the second direction VL2, respectively, to define the incident angle but is not limited thereto and therefore any opening OM1, OM2, and OM3 having a shape for measuring the incident angle may be easily derived from those skilled in the art, and therefore the modification thereof may also be included in the scope of the present invention.

Further, the first opening OM1, the second opening OM2, and the third opening OM3, respectively, according to the embodiment of the present invention may include a plurality of corners which is formed in a curved line. As described above, when the boundaries among the opening OM1, OM2, and OM3, respectively, have a curved line, the incident angle may be obtained by obtaining the curvature radius for the curved line and measuring an angle between a tangential line of a circular arc based on the corresponding curvature radius and the direction extending from the radial center RC.

In embodiments, the area AR1 and the spacer SP1 according to the embodiment of the present invention may have the radial center RC regardless of the shape and the size as illustrated in FIGS. 14 and 15. In embodiments, the radial center RC may be a center of gravity having a cross section in which the spacer SP1 is cut in a direction parallel with the substrate SU. However, this is only the embodiment of the present invention and unlike FIGS. 14 and 15, in the case of the spacer SP1 having a polygonal cross section, the intersecting point at which the polygonal diagonal lines coincide with each other may also be the radial center RC.

Any one point which is present in the cross section of the spacer SP1 other than the boundary of the spacer SP1 may be the radial center RC according to the embodiment of the present invention and as illustrated in FIGS. 11 to 15, the radial center RC according to the embodiment of the present invention may be disposed at the boundary of the first pixel PX1 and the second pixel PX2, respectively, but the present invention is not limited thereto and therefore the radial center RC may also be present in any one pixel.

According to the foregoing embodiments of the present invention, the organic light emitting diode display, which may have an area as large as possible within the areas AR1 and AR2 in which the spacer SP1 according to the embodiment of the present invention may be disposed and the spacer SP1 in which the occurrence of defects that the damaged debris of the spacer SP1 due to the external impact covers the vision of the openings OM1, OM2, and OM3 is reduced, may be provided.

Meanwhile, the spacer SP1 according to the embodiment of the present invention may be disposed in pair to face each other with respect to a central axis VCL of the third opening OM3 which is formed in a parallel direction with the second direction VL2. Therefore, as illustrated in FIGS. 2, 5, and 6, in the spacer SP1 according to the embodiment of the present invention, one spacer SP1 which is formed in a total of two pixels over one first pixel PX1 and one second pixel PX2 and one spacer SP1 which is formed in a total of four pixels over two first pixels PX1 and two second pixels PX2 may be disposed to face each other with respect to the central axis VCL of the third opening OM3.

Here, "facing" means that the spacer SP1 may be disposed at both sides based on the central axis VCL and does not mean that distances from the central axis VCL to a place where the spacer SP1 is disposed or the cross section of each spacer SP1 is completely the same. Therefore, the case in which the distance from the central axis VCL to a place where the spacer SP1 is disposed is slightly different or the cross section of each spacer SP1 disposed at both side with respect to the central axis VCL is different from each other may be included in the scope of the present invention.

Figure 16:
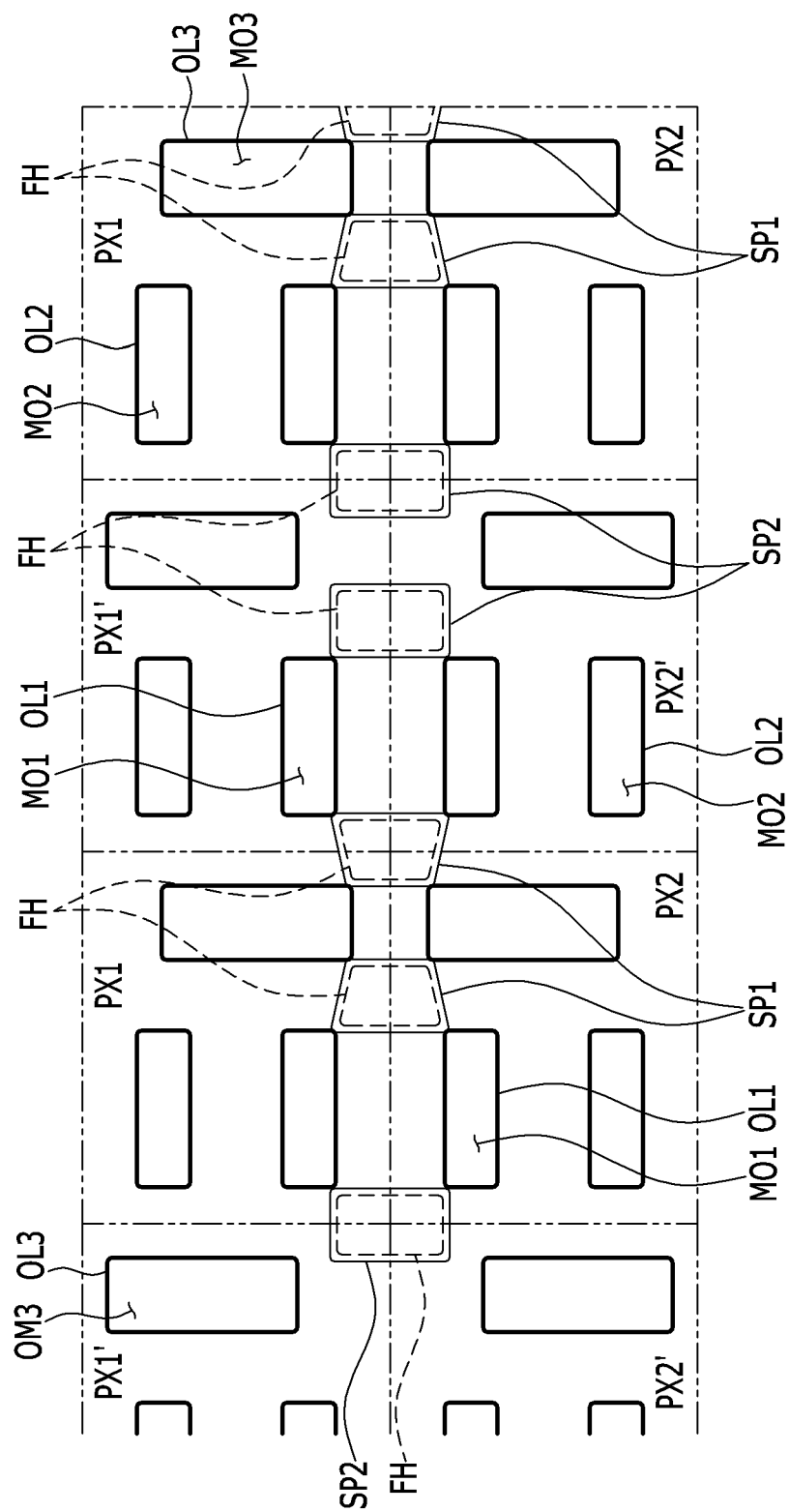
FIG. 16 is a diagram illustrating an organic light emitting diode display according to another embodiment of the present invention.

FIG. 16 illustrates a disposition of the spacers SP1 and SP2 according to a modified embodiment of the present invention. According to the modified example of the present invention, the third opening OM3 formed in the pixel defining layer (PDL) is formed to have a period for which it is repeated over at least two pixels. FIG. 16 illustrates a period for which a disposition of the third opening OM3 is repeated over two pixels.

Therefore, as illustrated in FIG. 16, a size or a shape of the areas AR1 and AR2 in which the spacers SP1 and SP2 may be formed are repeated over at least two pixels and the spacers SP1 and SP2 having different cross sections may be formed in each region AR1 and AR2.

Meanwhile, the spacer SP1 according to the embodiment of the present invention may be made of the same material as the pixel defining layer (PDL). For example, the spacer SP1 may be made of the same material as polymer and may be made of a material having different physical properties.

The organic light emitting diode display according to the embodiment of the present invention as described above may remarkably reduce the possibility of invading the debris of the damaged spacer SP1 into the openings OM1, OM2, and OM3 of the pixel defining layer (PDL) even though the spacer SP1 is damaged by the external impact to reduce the occurrence of defects of products, thereby remarkably reducing the occurrence rate of defects of products.

Hereinafter, a method for manufacturing an organic light emitting diode display according to another embodiment of the present invention will be described.

According to the embodiment of the present invention, a method for manufacturing an organic light emitting diode display includes forming the electrode on or over the substrate (SU), forming the pixel defining layer (PDL), forming the spacer SP1, and forming the organic emission layers OL1, OL2, and OL3.

The forming of the electrode over the substrate (SU) is forming the electrode of a conductive material over a hard or soft substrate (SU) including materials such as ceramic, metal, or synthetic resin.

The electrode may include metal, oxides such as indium tin oxide (ITO), and materials such as carbon nanotube (CNT) but the embodiment of the present invention is not limited thereto. Therefore, any material through which electricity may be conducted may be included in the scope of the present invention.

Meanwhile, the forming of the circuit layer FC on or over the substrate (SU) may be first performed before the forming of the electrode according to the embodiment of the present invention is performed. The circuit layer FC may be formed to be electrically connected to the electrode by the known method to transfer the electrical signal to the electrode.

In embodiments, as the electrode formed on or over the substrate (SU) according to the embodiment of the present invention, a plurality of electrodes including the first electrode E1, the second electrode E2, and the third electrode E3 may be formed.

The forming of the pixel defining layer (PDL) is forming the pixel defining layer (PDL) including the plurality of openings OM1, OM2, and OM3 through which the plurality of electrodes are exposed. In embodiments, each opening OM1, OM2, and OM3 is formed after a layer of the pixel defining layer (PDL) material is formed or may be simultaneously formed with forming the pixel defining layer (PDL) by designating a position at which the opening OM1, OM2, and OM3 are formed in advance. However, the embodiment of the present invention is not limited thereto. The forming of the openings OM1, OM2, and OM3 may be performed based on various modified examples.

The forming of the spacer SP1 is forming the spacer SP1 in the areas AR1 and AR2 on the pixel defining layer (PDL) which abuts to one corner of the first opening OM1 of the first pixel PX1, one corner of the second opening OM2 of the second pixel PX2, one corner of the third opening OM3 of the first pixel PX1, and one corner of the third opening OM3 of the second pixel PX2.

However, in alterative embodiments, the areas AR1 and the AR2 do not abut to any one of the foregoing four corners. Further, even the case in which the areas AR1 and AR2 are formed by connecting the second opening OM2 and the third opening OM3 of the first pixel PX1 and the first opening OM1 and the third opening OM3 of the second pixel PX2, may be easily derived from the embodiment of the present invention, which may be included in the scope of the present invention.

In embodiments, the forming of the spacer SP1 according to the embodiment of the present invention includes forming the receiving groove (FH), applying the spacer SP1 material, and making the spacer SP1 reflow.

The forming of the receiving groove (FH) is forming the receiving groove (FH) which is partially or completely filled with the spacer SP1 reflowing in the making the spacer SP1 reflow which will be described below on the pixel defining layer PDL of the position corresponding to the shape of the spacer SP1. The boundary may be clearly formed by the receiving groove (FH) even though the spacer SP1 according to the embodiment of the present invention is subjected to the reflowing.

The applying of the spacer SP1 material is applying a material forming the spacer SP1 in the boundary of the spacer SP1 formed on the pixel defining layer (PDL) by the receiving grove (FH). In embodiments, the spacer SP1 according to the embodiment of the present invention may be made of the same material as the pixel defining layer (PDL), but is not limited thereto.

As described above, FIGS. 4 and 5 illustrate an appearance in which the spacer SP1 material is applied within the boundary area formed by the receiving groove (FH). As illustrated in FIGS. 4 and 5, since the reflow process is not yet performed, the spacer SP1 material is not yet filled in the receiving groove (FH), and therefore the receiving groove (FH) is exposed to the outside.

The reflowing of the spacer SP1 is improving an adhesion of the spacer SP1 formed by heating the applied spacer SP1 material.

In embodiments, according to the embodiment of the present invention, in the reflowing of the spacer SP1, the spacer SP1 is heated and thus the material forming the spacer SP1 may have flowability. Therefore, the material forming the spacer SP1 may have a changed shape in a direction in which the surface energy is reduced depending on thermodynamics laws.

Generally, the shape which may minimize the surface energy is a spherical shape in the case of three dimension or a circular shape in the case of two dimension. However, in embodiments, the material would not be formed by a complete spherical shape or circular shape due to the physical properties of the material and the external environments such as reflow temperature, but the scope of the present invention may include the case in which the spacer SP1 is not formed in a complete spherical shape or circular shape.

Therefore, when the spacer SP1 is heated, the spacer SP1 is deformed to approach the possible spherical shape or circular shape, the boundary or corner of the spacer SP1 may be rounded, or the boundary having the cross section of the spacer SP1 may be rounded.

Further, according to the embodiment of the present invention, when the spacer SP1 is heated, the spacer SP1 material having flowability flows in the receiving groove (FH) and thus all or a portion of the receiving groove (FH) may be filled.

As described above, FIGS. 1 to 3 illustrate that the receiving groove (FH) is filled by performing the reflow process and the surface of the spacer SP1 is rounded. The receiving groove (FH) is filled by making the spacer SP1 material flowing in the receiving groove (FH) and thus the boundary of the spacer SP1 is defined by the receiving groove (FH) to be clearly formed without being dispersed.

Meanwhile, the forming of the organic emission layers OL1, OL2, and OL3 is forming the organic emission layers OL1, OL2, and OL3 by depositing the organic emission material in the openings OM1, OM2, and OM3 formed in the pixel defining layer (PDL).

In embodiments, when the organic emission layers OL1, OL2, and OL3 according to the embodiment of the present invention is applied with electricity, the first opening OM1, the second opening OM2, and the third opening OM3 may be each formed to represent different colors.

To form the organic emission layers OL1, OL2, and OL3, the mask of which the positions corresponding to each opening OM1, OM2, and OM3 are opened may be used and when the organic emission material is deposited, the mask may be supported by the spacer SP1.

The organic light emitting diode display according to the embodiment of the present invention may be manufactured by forming the organic emission layers OL1, OL2, and OL3 and then forming the electrode again, and sealing the upper portion of the substrate (SU) including the spacer SP1 and the pixel defining layer.

Hereinabove, the organic light emitting diode display according to the embodiment of the present invention and the method for manufacturing the same according to another embodiment of the present invention are described.

According to an embodiment of the present invention, it is possible to provide the organic light emitting diode display and the method for manufacturing the same capable of remarkably reducing the possibility of invading the debris of the damaged spacer SP1 into the openings OM1, OM2, and OM3 of the pixel defining layer (PDL) even though the spacer SP1 is damaged by the external impact to reduce the occurrence of defects of products, thereby remarkably reducing the occurrence rate of defects of products.

As described above, embodiments of the present invention are described with reference to the drawings, but the present invention is not limited to the above-mentioned embodiments. Therefore, the present invention is not limited to the above embodiments and can be variously changed and modified from the description by a person skilled in the art to which the present invention pertains.

Therefore, the modified examples or the changed examples are not to be individually construed from the technical spirit of the present invention and therefore the modified embodiments are to be construed to be included in claims of the present invention.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
a substrate comprising a major surface;
a plurality of electrodes positioned over the substrate;
a pixel defining layer positioned over the plurality of electrodes and comprising a plurality of openings, each of which is disposed over and overlaps one of the plurality of electrodes; and
a spacer positioned over the pixel defining layer and formed of polymer,
wherein the plurality of electrodes comprises first, second, third and fourth electrodes,
wherein the plurality of openings comprises first, second, third and fourth openings overlapping the first, second, third and fourth electrodes, respectively, when viewed in a viewing direction perpendicular to the major surface, wherein the first, second, third and fourth openings comprise first, second, third and fourth corners, respectively, wherein the first, second, third and fourth corners neighbor one another when viewed in the viewing direction,
wherein, when viewed in the viewing direction, the spacer comprises at least a portion placed within an imaginary polygon defined by the first, second, third and fourth corners and
wherein the cross section in which the spacer is cut in a direction parallel to the major surface of the substrate has a trapezoidal shape having a pair of sides substantially parallel to each other and another pair of sides not parallel to each other.

2. The device display of claim 1, wherein the plurality of electrodes further comprise fifth and sixth electrodes,
wherein the plurality of openings comprise fifth and sixth openings overlapping the fifth and sixth electrodes, respectively, when viewed in the viewing direction,
wherein the device comprises first and second pixels, each of which comprises first, second and third sub-pixels, the first, second and third sub-pixels configured to emit colored light having colors different from one another,
wherein the first, third and fifth openings belong to the first, second and third sub-pixels of the first pixel, respectively,
wherein the second, fourth and sixth openings belong to the first, second and third sub-pixels of the second pixel, respectively,
wherein the first, second, fifth and sixth openings are arranged such that their long sides are substantially parallel to each other when viewed in the viewing direction,
wherein the third and fourth openings are arranged such that their long sides are substantially aligned to an imaginary straight line when viewed in the viewing direction,
wherein the first and fourth corners are diagonally disposed, and the second and third corners are diagonally disposed.

3. The display of claim 2, wherein, when viewed in the viewing direction, the spacer does not comprise a portion disposed between the first and second openings, between the first and third openings, between the second and fourth openings or between the third and fourth openings.

4. The display of claim 1, wherein each of the first, second, third and fourth openings has a generally rectangular shape, wherein, when viewed in the viewing direction, the first and second openings are arranged such that their long sides are substantially parallel to a first direction and the third and fourth openings are arranged such that their long sides are substantially parallel to a second direction which is perpendicular to the first direction.

5. The display of claim 1, wherein each of the first, second, third and fourth corners is rounded.

6. The display of claim 1, wherein, when viewed in the viewing direction, the spacer comprises a center of gravity of a cross section taken parallel to the major surface of the substrate, wherein an imaginary straight line extending from the center and crossing any one of sides of the first, second, third and fourth openings forms an angle with that side, the angle being smaller than 90°, wherein, when viewed in the viewing direction, two imaginary tangential lines extending from the center to any one of the first, second, third and fourth corners form an angle therebetween which is smaller than 90°.

7. The display of claim 1, wherein, when viewed in the viewing direction, the spacer comprises a center of gravity of a cross section taken parallel to the major surface of the substrate, wherein an imaginary straight line extending from the center and passing any one of the first, second, third and fourth corners passes through the corresponding opening comprising that corner.

8. The display of claim 1, wherein the third and fourth openings further comprise fifth and sixth corners, respectively, wherein the device further comprises an additional spacer disposed adjacent the fifth and sixth corners.

9. The display of claim 1, further comprising an additional spacer having a cross section shape different from that of the spacer when the spacer and the additional spacer are cut in a direction parallel to the major surface of the substrate.

10. The display of claim 1, wherein the spacer is made of the same material as the pixel defining layer.

11. The display of claim 1, further comprising first, second, third and fourth light emission layers formed over the first, second, third and fourth electrodes within the first, second, third and fourth openings, respectively, wherein each light emission layer comprises an organic light emission material.

12. The display of claim 1, wherein an area of the third opening is greater than that of the first opening or the second opening.

13. The display of claim 1, wherein the first, second, third and fourth openings do not comprises any area overlapping the imaginary polygon when viewed in the viewing direction.

14. The display of claim 1, wherein, when viewed in the viewing direction, the substantially entire portion of the spacer is enclosed within the imaginary polygon.

15. The device of claim 1, wherein the pixel defining layer further comprises a receiving groove which is formed along a boundary abutting to the pixel defining layer by the spacer to receive at least a portion of the spacer.

16. An organic light emitting diode display, comprising:
a substrate comprising a major surface;
a plurality of electrodes positioned over the substrate and including a first electrode, a second electrode, and a third electrode;
a pixel defining layer positioned over the plurality of electrodes and comprising a plurality of openings, each of which is disposed over and overlaps one of the plurality of electrodes; and
a spacer positioned over the pixel defining layer and formed of polymer, wherein the pixel defining layer includes a first pixel and a second pixel, wherein the first pixel and the second pixel each includes:
  a first opening disposed along a first direction and having the first electrode exposed therethrough;
  a second opening disposed to be spaced apart from the first opening along the first direction and having the second electrode exposed therethrough; and
  a third opening disposed to be spaced apart from the first opening and the second opening, respectively, along a second direction intersecting the first direction and having a third electrode exposed therethrough,
wherein the spacer is disposed in an area which is formed to abut to one corner of the first opening of the first pixel, one corner of the second opening of the second pixel, one corner of the third opening of the first pixel, and one corner of the third opening of the second pixel, respectively, and
wherein the cross section in which the spacer is cut in a direction parallel to the major surface of the substrate has a trapezoidal shape having a pair of sides substantially parallel to each other and another pair of sides not parallel to each other.

17. The display of claim 16, wherein, each of the first, second and third openings has a generally rectangular shape, wherein, when viewed in the viewing direction, the first and second openings are arranged such that their long sides are substantially parallel to a first direction and the third opening is arranged such that their long sides are substantially parallel to a second direction which is perpendicular to the first direction, and the spacer comprises a center of gravity of a cross section taken parallel to the major surface of the substrate, wherein an imaginary straight line extending from the center and crossing any one of sides of the first, second and third openings forms an angle with that side, the angle being smaller than 90°, wherein, when viewed in the viewing direction, two imaginary tangential lines extending from the center to any one of the first, second and third openings form an angle therebetween which is smaller than 90°.

18. The display of claim 16, wherein the pixel defining layer further comprises a receiving groove which is formed along a boundary abutting to the pixel defining layer by the spacer to receive at least a portion of the spacer.

* * * * *